US011237589B2

(12) United States Patent
Jan et al.

(10) Patent No.: US 11,237,589 B2
(45) Date of Patent: Feb. 1, 2022

(54) FLEXIBLE ELECTRONIC DEVICE (71) Applicants: Cheng-Shiue Jan, Taipei (TW); Wei-Hao Lan, Taipei (TW)

(72) Inventors: Cheng-Shiue Jan, Taipei (TW); Wei-Hao Lan, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 16/876,094

(22) Filed: May 17, 2020

(65) Prior Publication Data
US 2020/0379507 A1 Dec. 3, 2020

Related U.S. Application Data (60) Provisional application No. 62/850,522, filed on May 20, 2019.

(51) Int. Cl.
*G06F 1/16* (2006.01)
*H05K 5/00* (2006.01)
(Continued)

(52) U.S. Cl.
CPC ............ *G06F 1/1601* (2013.01); *F16C 11/04* (2013.01); *G06F 1/1681* (2013.01);
(Continued)

(58) Field of Classification Search
CPC .... G06F 1/1601; G06F 1/1681; G06F 1/1641; G06F 1/1652; G06F 2200/1612;
(Continued)

(56) References Cited

U.S. PATENT DOCUMENTS

2014/0198465 A1* 7/2014 Park .................. G09F 9/301
361/749
2015/0092361 A1* 4/2015 Cho .................. H01L 51/5237
361/749
(Continued)

FOREIGN PATENT DOCUMENTS

| CN | 104517557 | 4/2015 |
| CN | 104683719 | 6/2015 |
| CN | 108885478 | 11/2018 |

OTHER PUBLICATIONS

"Office Action of China Counterpart Application", dated Nov. 25, 2021, p. 1-p. 8.

*Primary Examiner* — Abhishek M Rathod
(74) *Attorney, Agent, or Firm* — JCIPRNET (57) ABSTRACT A flexible electronic device includes: a base; a supporting plate having a first end pivotally connected to the base, and a second end; two pivot modules disposed at the second end; a bearing frame having a fixed part connected to the two pivot modules, and two curved parts connected to the fixed part; a bending mechanism disposed on the fixed part and the two curved parts and connected to the pivot modules; and a flexible panel disposed on the bearing frame and covering the bending mechanism. When the flexible electronic device is switched to a curve mode, the bending module drives the two curved parts to stretch with respect to the fixed part to bend the flexible panel. When the flexible electronic device is switched to a flat mode, the bending module drives the two curved parts to move close to the fixed part to flatten the flexible panel.

11 Claims, 10 Drawing Sheets (51) Int. Cl.
    *F16C 11/04* (2006.01)
    *H05K 5/02* (2006.01)
(52) U.S. Cl.
    CPC ......... *H05K 5/0017* (2013.01); *H05K 5/0226* (2013.01); *G06F 1/1641* (2013.01)
(58) Field of Classification Search
    CPC ....... G06F 3/041; F16C 11/04; H05K 5/0226; H05K 5/0017; F16M 11/10; F16M 11/2021; F16M 11/38; G09F 9/301
    See application file for complete search history.

(56) References Cited

U.S. PATENT DOCUMENTS

| | | | |
|---|---|---|---|
| 2016/0357052 A1* | 12/2016 | Kim | H01L 51/5237 |
| 2017/0124937 A1* | 5/2017 | Kim | G09F 9/301 |
| 2017/0289491 A1* | 10/2017 | Park | G09G 3/3216 |
| 2018/0097197 A1* | 4/2018 | Han | G06F 1/3265 |
| 2018/0220537 A1* | 8/2018 | Heo | G09F 9/3026 |
| 2018/0226001 A1* | 8/2018 | Chen | G09F 15/0031 |
| 2018/0340645 A1* | 11/2018 | Chen | F16M 11/126 |
| 2019/0237685 A1* | 8/2019 | Kang | G06F 1/1652 |
| 2019/0239369 A1* | 8/2019 | Lan | H05K 5/0017 |
| 2019/0383438 A1* | 12/2019 | Li | G02F 1/133305 |

* cited by examiner

FLEXIBLE ELECTRONIC DEVICE

CROSS-REFERENCE TO RELATED APPLICATION

This application claims the priority benefit of U.S. provisional application Ser. No. 62/850,522, filed on May 20, 2019. The entirety of the above-mentioned patent application is hereby incorporated by reference herein and made a part of specification.

BACKGROUND

Technical Field

The disclosure relates to an electronic device, in particular relates to a flexible electronic device which can be switched between a curve mode and a flat mode.

Description of Related Art

Current electronic displays are mainly used to display images, texts, or videos converted from digital signals. This type of electronic display is suitable for televisions, desktop computers, digital signage, or portable electronic devices such as tablet computers, notebook computers, and smartphones. Most of the existing display screens have a touch function in place of current physical buttons. Taking a desktop computer as an example, a display screen thereof is usually connected to a support structure perpendicular to the desktop, so that the display screen is suspend over the desktop and faces a user. When performing a touch operation, an arm needs to suspend over the desktop for a finger to touch the screen. However, the current touch method in which the arm suspends over the desktop, the arm is prone to soreness and fatigue during a long-time touch operation in the absence of a support. In addition, the touch function of the current display screen is only limited to a simple touch operation, and is not suitable for delicate operations such as drawing and writing.

SUMMARY

The disclosure provides a flexible electronic device which can be switched between a curve mode and a flat mode. In the curve mode, the flexible electronic device is switched to a curved surface to improve the viewing experience, and in the flat mode, the flexible electronic device is switched to a flat surface to facilitate a touch operation.

The flexible electronic device in the disclosure includes a base, a supporting plate, two pivot modules, a bearing frame, a bending mechanism, and a flexible panel. The supporting plate has a first end and a second end. The first end is pivotally connected to the base. The two pivot modules are disposed at the second end of the supporting plate. The bearing frame has a fixed part and two curved parts. The fixed part is connected to the two pivot modules. The two curved parts are respectively connected to two opposite sides of the fixed part. The bending mechanism is disposed on the fixed part and the two curved parts, and connects the two pivot modules. The flexible panel is disposed on the bearing frame and covers the bending mechanism and the two pivot modules. When the curve mode is switched on, the bending mechanism drives the two curved parts to stretch with respect to the fixed part, and bends the flexible panel. When the flat mode is switched on, the bending mechanism drives the two curved parts to move close to the fixed part, and flattens the flexible panel.

Based on the foregoing, the flexible electronic device of the disclosure is adapted to be switched between the curve mode and the flat mode. In the curve mode, the bending mechanism bends the bearing frame to increase the bending curvature of the flexible panel. In the flat mode, the bending mechanism restores the bearing frame to flatten the flexible panel. In addition, in the flat mode, the bearing frame and the flexible panel can rotate with respect to the supporting plate to change an angle therebetween. As such, it is possible to prevent the flexible panel from being suspended, so that the flexible panel is suitable for long-time touch operation.

Furthermore, the flexible electronic device of the disclosure can be quickly switched between the curve mode and the flat mode through rotation by an external force, which can overcome the disadvantage that the current electronic devices cannot have both a curved screen and a flat touchscreen at the same time, and provide a good user experience.

DESCRIPTION OF THE EMBODIMENTS

Figure 1A:
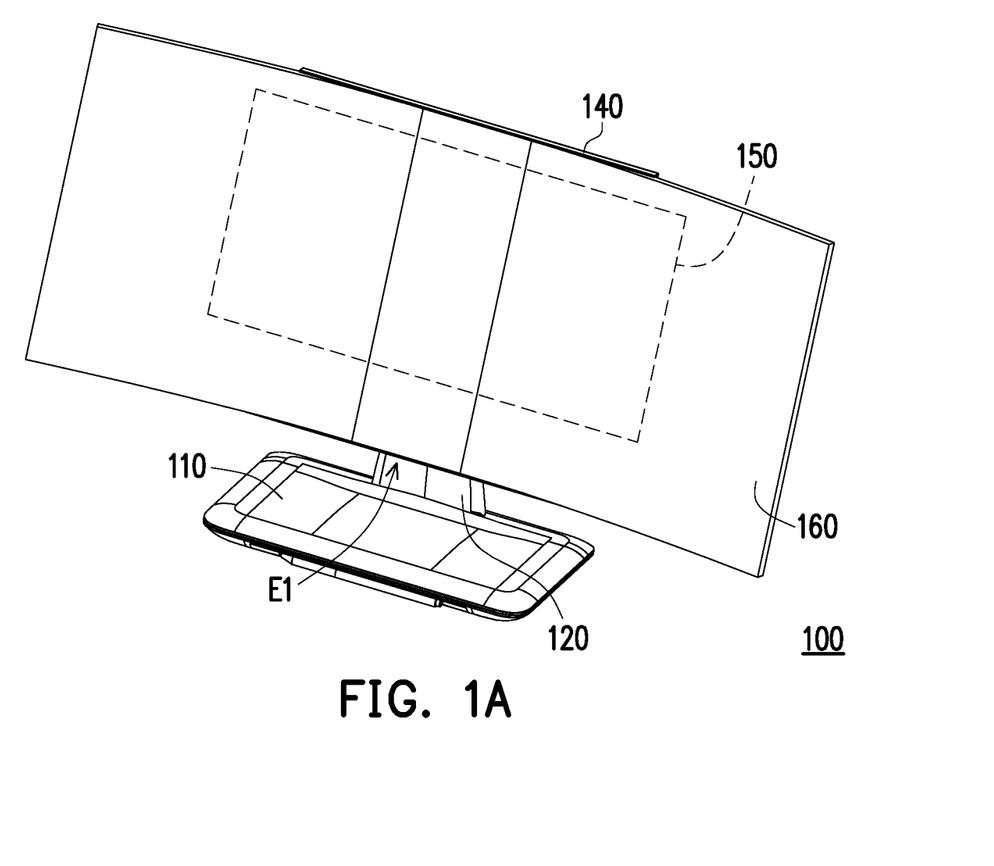
FIG. 1A is a schematic perspective view of a curve mode of a flexible electronic device according to an embodiment of the disclosure.
Figure 1B:
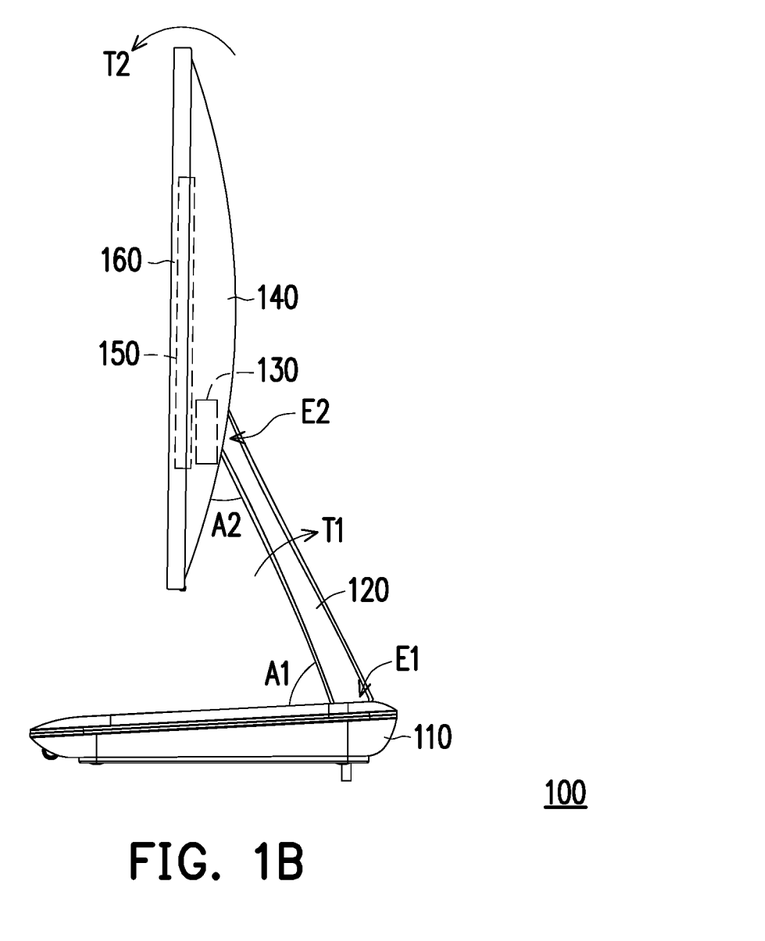
FIG. 1B is a schematic side plan view of the flexible electronic device of FIG. 1A.
Figure 1C:
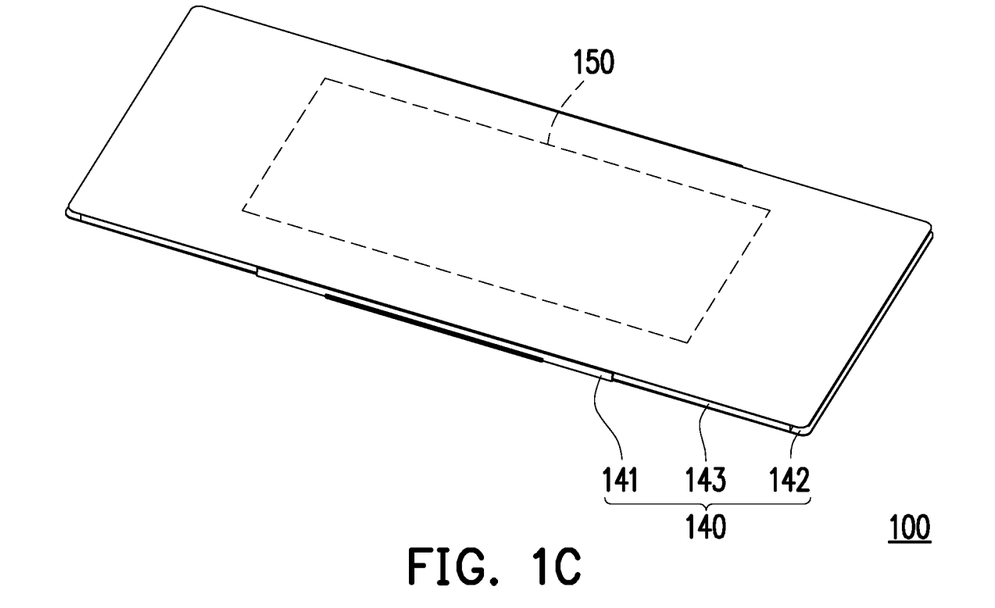
FIG. 1C is a schematic perspective view of a flat mode of the flexible electronic device of FIG. 1A.
Figure 1D:
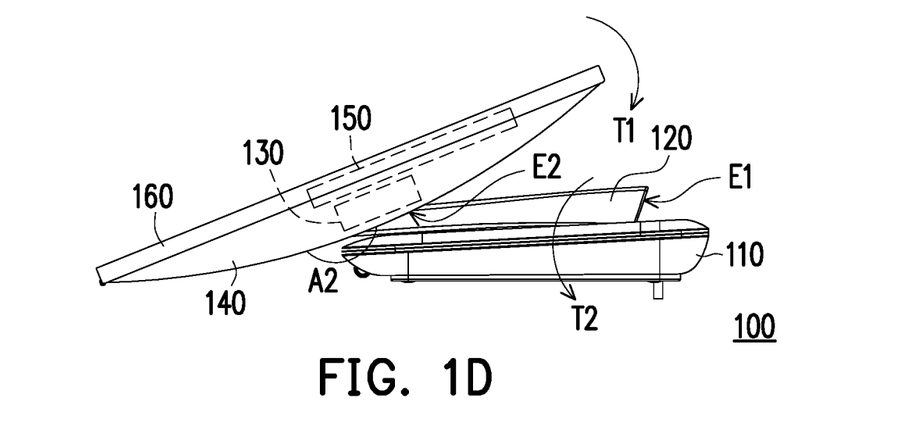
FIG. 1D is a schematic side plan view of the flexible electronic device of FIG. 1C.
Figure 1E:
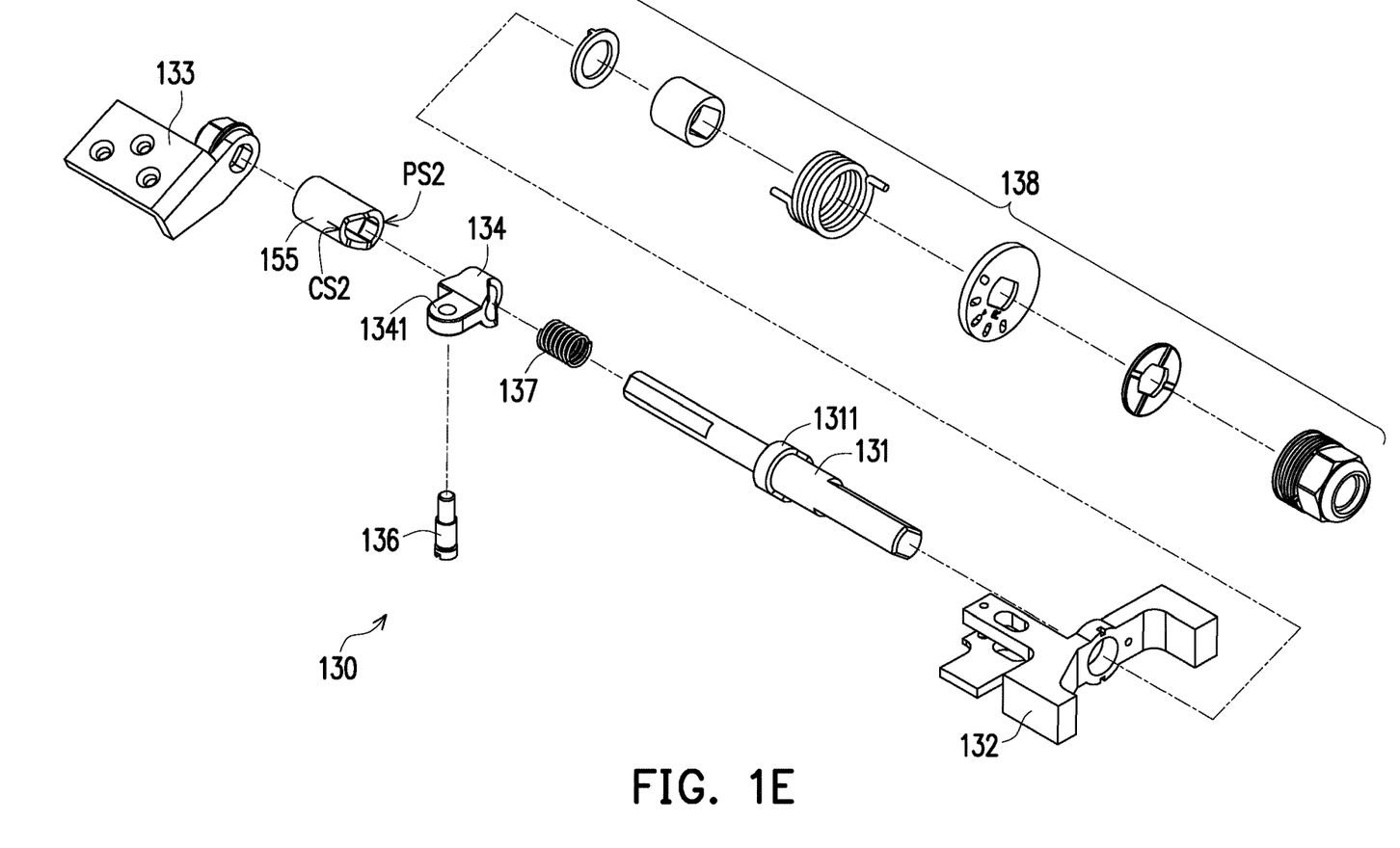
FIG. 1E is an exploded perspective view of elements of one single pivot module of FIG. 1B.

FIG. 1A is a schematic perspective view of a curve mode of a flexible electronic device according to an embodiment of the disclosure. FIG. 1B is a schematic side plan view of the flexible electronic device of FIG. 1A. FIG. 1C is a schematic perspective view of a flat mode of the flexible electronic device of FIG. 1A. FIG. 1D is a schematic side view plan view of the flexible electronic device of FIG. 1C. FIG. 1E is an exploded perspective view of elements of one single pivot module of FIG. 1B.

Referring to FIG. 1A to FIG. 1D, the flexible electronic device 100 of this embodiment is, for example, a simple display device for being combined with a desktop computer, or a computer which is a combination of a host and a display screen.

The flexible electronic device 100 includes a base 110, a supporting plate 120, two pivot modules 130, a bearing frame 140, a bending mechanism 150, and a flexible panel 160. The base 110 is disposed on a desktop or other surfaces. The supporting plate 120 has a first end E1 and a second end E2. The first end E1 is pivotally connected to the base 110. Specifically, the first end E1 is pivotally connected to the base 110 through a hinge structure, and the hinge structure can provide a torque to the first end E1 of the supporting plate 120. Therefore, the supporting plate 120 can rotate and have a first angle A1 with respect to the base 110, and the vertical height of the flexible panel 160 with respect to the base 110 may be adjusted freely to meet different requirements.

Referring to FIG. 1C and FIG. 1E, the two pivot modules 130 are spaced apart from each other and are respectively disposed on the second end E2 of the supporting plate 120. The bearing frame 140 has a fixed part 141, two curved parts 142, and two buffer members 143. The fixed part 141 is connected to the two pivot modules 130, and can thus be rotated with respect to the supporting plate 120 to adjust a second angle A2. The plurality of curved parts 142 are pivotally connected to two opposite sides of the fixed part 141, respectively. The two buffer members 143 are disposed on the fixed part 141 and the two curved parts 142 along a horizontal direction PD, and are parallel to each other.

The bending mechanism 150 is disposed on the fixed part 141 and the two curved parts 142, connects the two pivot modules 130, and is configured to drive the plurality of curved part 142. The flexible panel 160 is disposed on the two buffer members 143 of the bearing frame 140 to be spaced apart from the fixed part 141 and the two curved parts 142, and covers the bending mechanism 150 and the two pivot modules 130. In addition, the two buffer members 143 are configured to absorb the stress generated when the flexible panel 160 is bent to avoid damage to the flexible panel 160.

Referring to FIG. 1A and FIG. 1B, when the flexible electronic device 100 is switched to the curve mode, the bending mechanism 150 drives the two curved parts 142 to stretch with respect to the fixed part 141. The flexible panel 160 is bent thereby and exhibited in the shape of a curved surface. The curved flexible panel 160 is close to the appearance of a human eye, and is helpful in reducing the rotation of the eyes or the head and alleviating fatigue. Specifically, the supporting plate 120 rotates in a first rotation direction T1 with respect to the base 110, and the first angle A1 is formed between the supporting plate 120 and the base 110. The bearing frame 140 rotates in a second rotation direction T2 opposite to the first rotation direction T1 with respect to the supporting plate 120 through the two pivot modules 130. Also, the bearing frame 140 and the supporting plate 120 have a second angle A2 therebetween. The first angle A1 and the second angle A2 are both acute angles. In this state, the bearing frame 140 is perpendicular to the base 110 and faces the user to provide convenience of viewing.

Referring to FIG. 1C and FIG. 1D, when the flexible electronic device 100 is switched to the flat mode, the bending mechanism 150 drives the two curved parts 142 to move close to the fixed part 141. The flexible panel 160 is flattened thereby and exhibited in the shape of a tablet. Specifically, the supporting plate 120 rotates in the second rotation direction T2 with respect to the base 110, and the supporting plate 120 is stacked on the base 110. The bearing frame 140 rotates in the first direction T1 with respect to the supporting plate 120 through the two pivot modules 130, and the second angle A2 between the bearing frame 140 and the supporting plate 120 is an obtuse angle. In this state, the bearing frame 140 is supported by the base 110, as well as the desktop or the surface, allowing the user to rest their arms, and is suitable for a long-time use, or delicate touch operations such as drawing or writing.

Figure 2A:
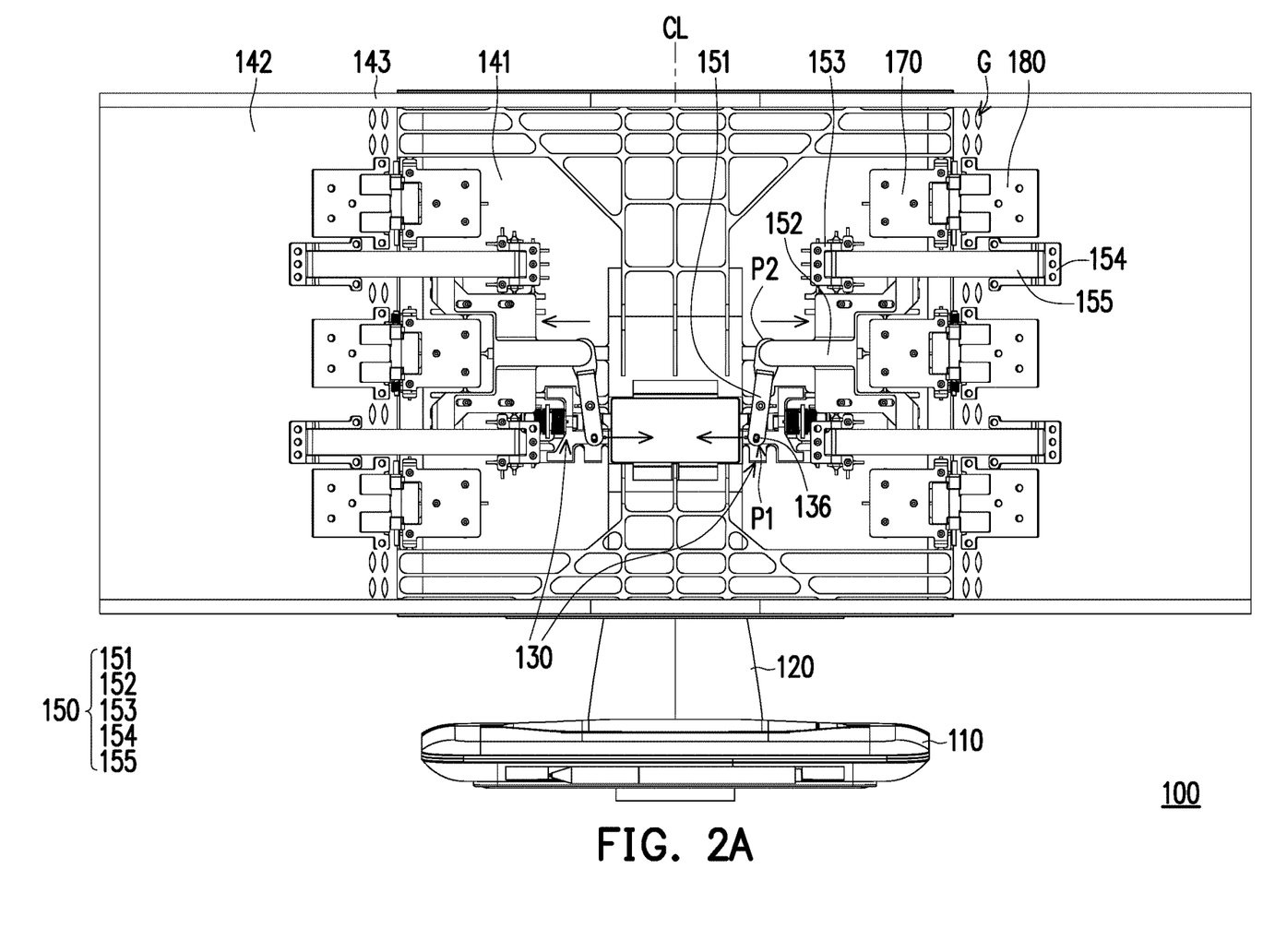
FIG. 2A is a schematic front plan view of part of elements of the flexible electronic device of FIG. 1A.
Figure 2B:
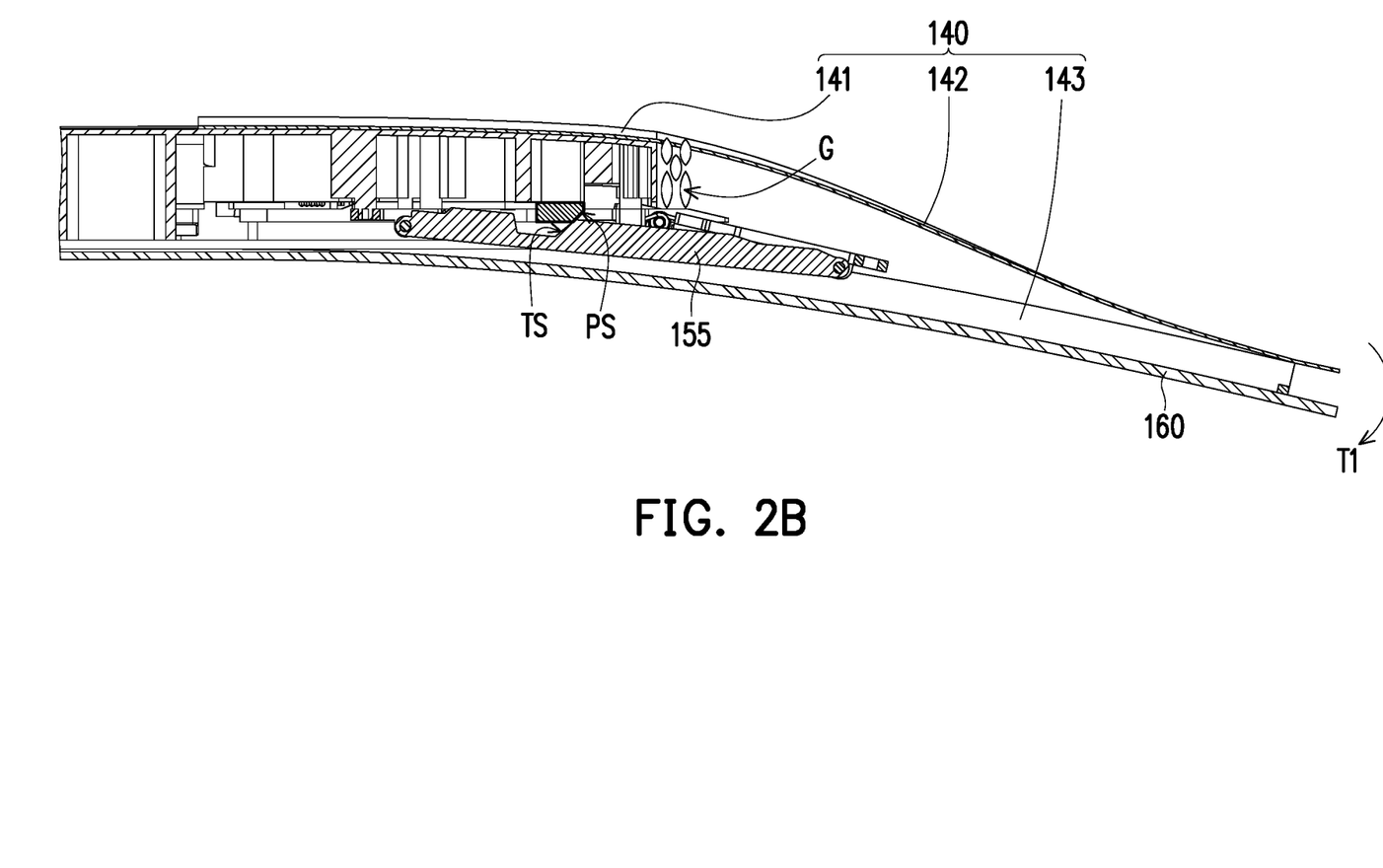
FIG. 2B is a schematic cross-sectional view of the flexible electronic device of FIG. 2A along the line A-A.
Figure 2C:
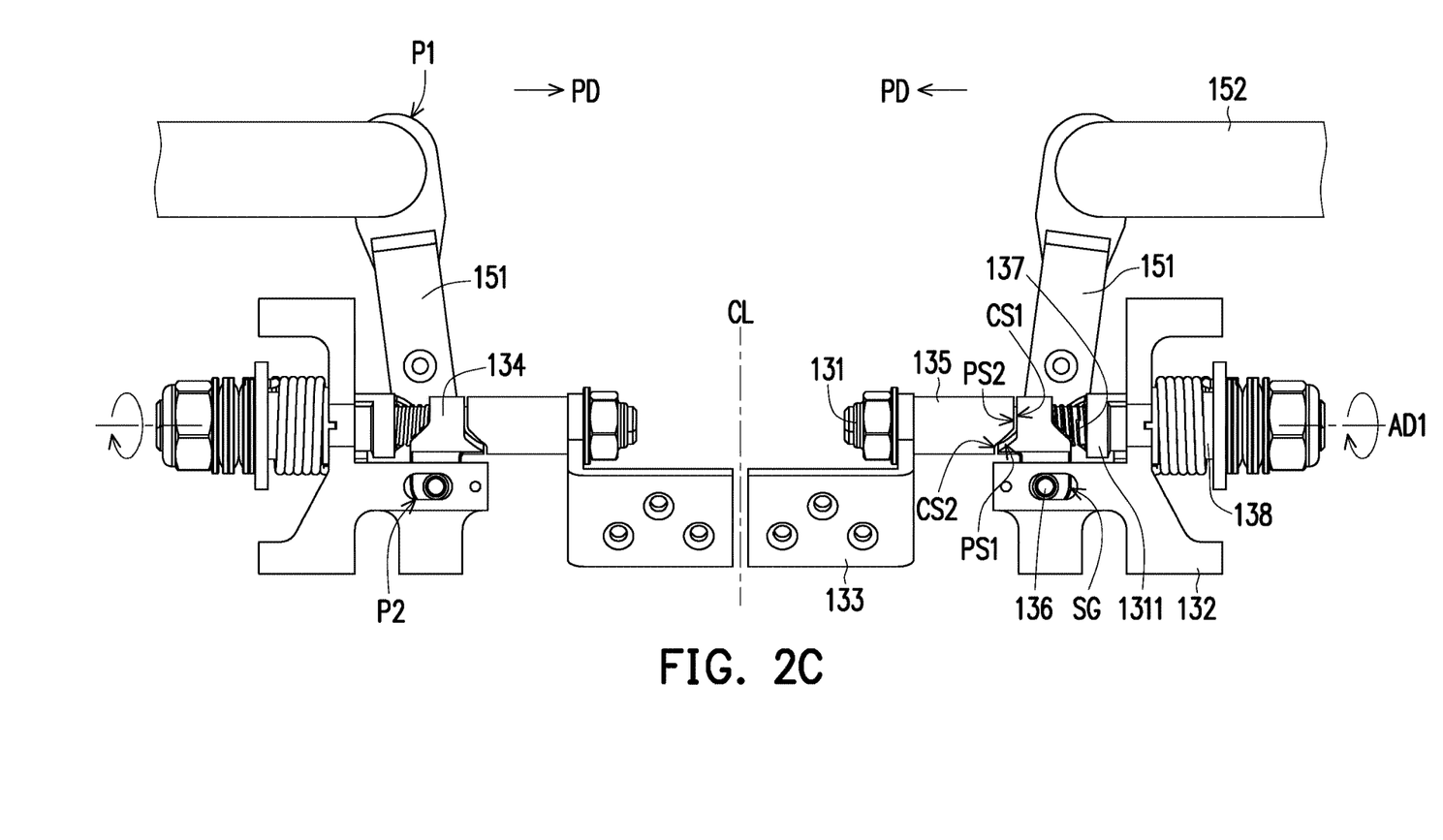
FIG. 2C is a schematic diagram showing the positional relationship between a bending mechanism and two pivot modules of FIG. 2A.

FIG. 2A is a schematic front plan view of part of elements of the flexible electronic device of FIG. 1A. FIG. 2B is a schematic cross-sectional view of the flexible electronic device of FIG. 2A along the line A-A. FIG. 2C is a schematic diagram showing the positional relationship between the bending mechanism and the two pivot modules of FIG. 2A.

Figure 3A:
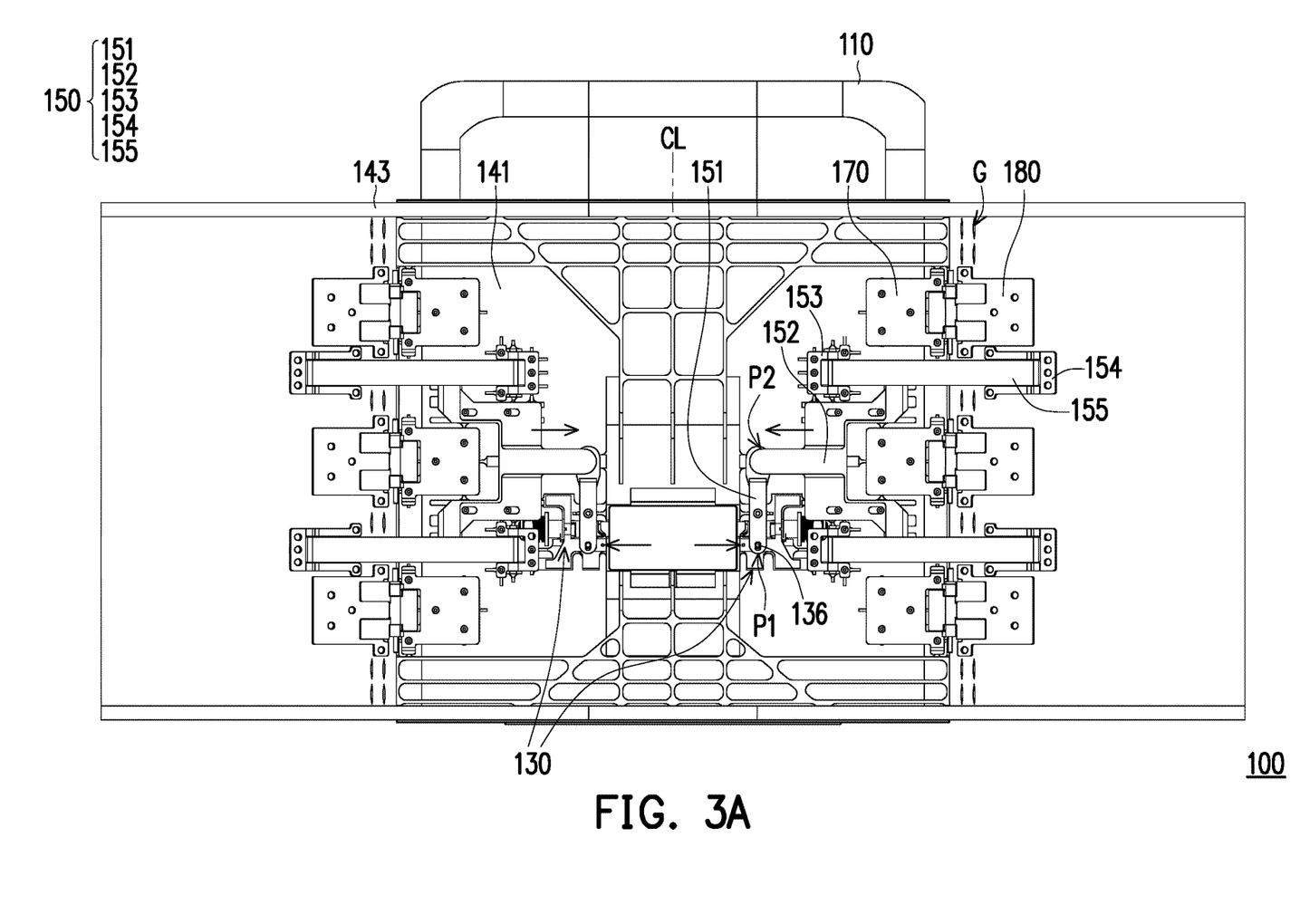
FIG. 3A is a schematic front plan view of part of elements of the flexible electronic device of FIG. 1C.
Figure 3B:
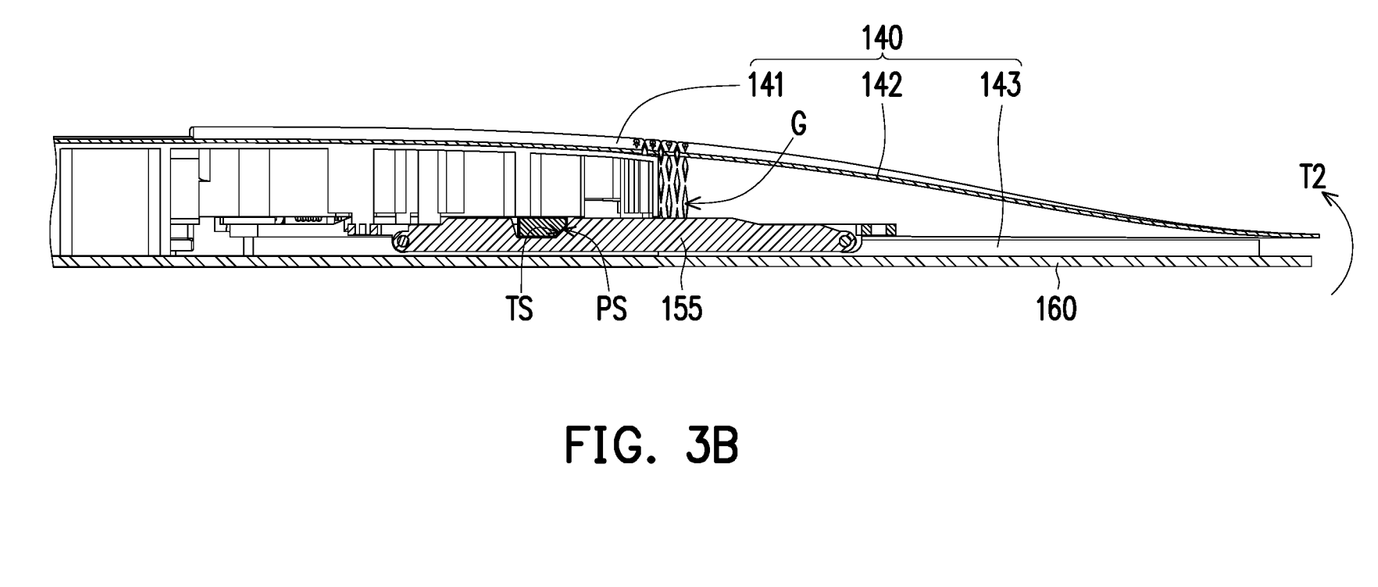
FIG. 3B is a schematic cross-sectional view of the flexible electronic device of FIG. 3A along the line B-B.
Figure 3C:
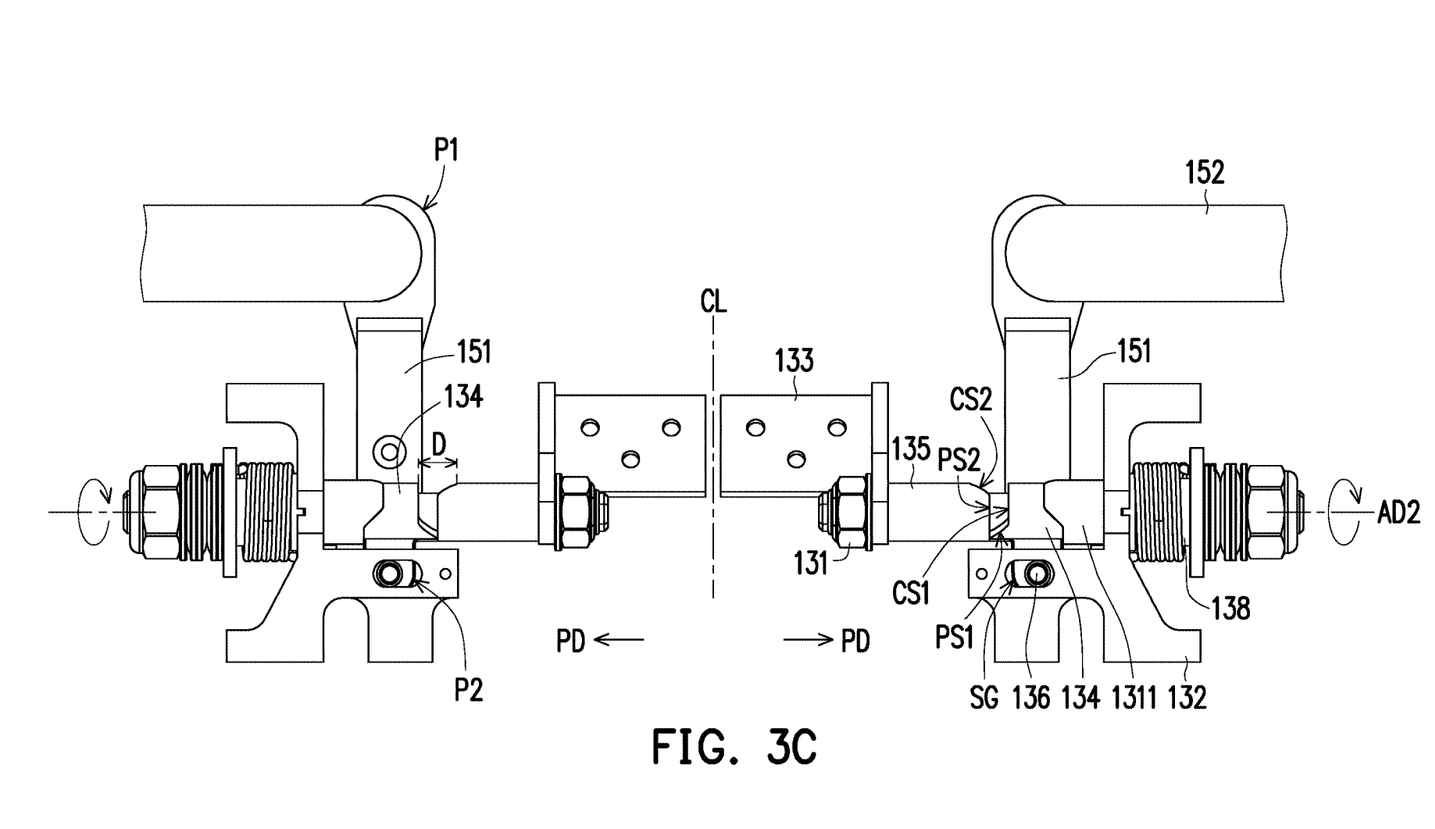
FIG. 3C is a schematic diagram showing the positional relationship between a bending mechanism and two pivot modules of FIG. 3A.

FIG. 3A is a schematic front plan view of part of elements of the flexible electronic device of FIG. 1C. FIG. 3B is a schematic cross-sectional view of the flexible electronic device of FIG. 3A along the line B-B. FIG. 3C is a schematic diagram showing the positional relationship between the bending mechanism and the two pivot modules of FIG. 3A.

With reference to FIG. 1E and FIG. 2C, each of the pivot modules 130 includes a pivot shaft 131, a first support bracket 132, a second support bracket 133, a first cam member 134, a second cam member 135, a linking pin 136, an auxiliary elastic member 137, and a torque member 138.

The first support bracket 132 is rotatably sleeved on the pivot shaft 131 and is connected to the fixed part 141 of the bearing frame 140. The first support bracket 132 has a sliding groove SG. The second support bracket 133 is sleeved on and fixed to the pivot shaft 131 and is connected to the second end E2 of the supporting plate 120. The first cam member 134 is rotatably and moveably sleeved on the pivot shaft 131. A retaining part 1341 of the first cam member 134 is aligned with the sliding groove SG of the first support bracket 132. The second cam member 135 is sleeved on and fixed to the pivot shaft 131 and is adjacent to the second support bracket 133. The linking pin 136 is disposed through the retaining part 1341 of the first cam member 134 and the sliding groove SG of the first support bracket 132, and is connected to the bending mechanism 150.

In addition, the first cam member 134 has a first protruding surface PS1 and a first recessed surface CS1. The second cam member 135 has a second protruding surface PS2 and a second recessed surface CS2. The auxiliary elastic member 137 is sleeved on the pivot shaft 131, and abuts against the first cam member 134 and an outer ring member 1311 of the first pivot shaft 131, respectively, thereby continuously providing an elastic force to push the first cam member 134. The torque member 138 is sleeved on an end of the pivot shaft 131 opposite to the second cam member 135, and is adjacent to the first support bracket 132 to provide a torque.

Referring to FIG. 1B, FIG. 2A, and FIG. 2C, when each of the second support brackets 133 and each of the pivot shafts 131 pivotally rotate in a first axial direction AD1 with respect to each of the first support brackets 132, the first cam member 134 is driven to slide along the pivot shaft 131 to move close to the second cam member 135 (namely, the first protruding surface PS1 and the first recessed surface CS1 correspond to the second recessed surface CS2 and the second protruding surface PS2, respectively), and the retaining part 1341 of the first cam member 134 drives the linking pin 136 to move in the sliding groove SG of the first support bracket 132, relatively moving close to a center line CL of the bearing frame 140.

Referring to FIG. 1C, FIG. 3A and FIG. 3C, when each of the second support brackets 133 and each of the pivot shafts 131 pivotally rotate in a second axial direction AD2 opposite to the first axial direction AD1 with respect to each of the first support brackets 132, the first cam member 134 is driven to slide along the pivot shaft 131 to partially abut against the second cam member 135 (namely, the first protruding surface PS1 and the second protruding surface PS2 abut against each other) and form a distance D (namely, the first recessed surface CS1 and the second recessed surface CS2 are spaced apart from each other), and the retaining part 1341 of the first cam member 134 drives the linking pin 136 to move in the sliding groove SG of the first support bracket 132, relatively moving away from the center line CL of the bearing frame 140.

With reference to FIG. 2A, FIG. 2B, FIG. 3A, and FIG. 3B, the flexible electronic device 100 further includes a plurality of inner rotating support brackets 170 and a plurality of outer rotating support brackets 180. The inner rotating support brackets 170 are respectively disposed on both sides of the fixed part 141 and face the flexible panel 160. The plurality of outer rotating support brackets 180 are respectively disposed on the two curved parts 142 and face the flexible panel 160. Each of the outer rotating support brackets 180 is pivotally connected to each corresponding inner rotating support bracket 170, so that each of the curved parts 142 is bendable with respect to the fixed part 141.

Referring to FIG. 2A, FIG. 2B, FIG. 3A, and FIG. 3B, the bending mechanism 150 includes two linking rods 151, two middle connecting rods 152, a plurality of inner support brackets 153, a plurality of outer support brackets 154, and a plurality of protruding connecting rods 155.

The two linking rods 151 are pivotally connected to the fixed part 141 of the bearing frame 140 and each of the linking rods 151 has a first end part P1 and a second end part P2. Each of the first end parts P1 is pivotally connected to each of the linking pins 136. The two middle connecting rods 152 are pivotally connected to the second end part P2 of the two linking rods 151, respectively. The plurality of inner support brackets 153 are respectively disposed on both sides of the fixed part 141 and face the flexible panel 160. The plurality of outer support brackets 154 are respectively disposed on the two curved parts 142 and face the flexible panel 160. The plurality of protruding connecting rods 155 are rotatably connected to the plurality of corresponding inner support brackets 153 and the plurality of corresponding outer support brackets 154, respectively. The two middle connecting rods 152 respectively abut against the plurality of corresponding protruding connecting rods 155.

The two middle connecting rods 152 are adapted to move away from each other along a horizontal direction PD, and push against the plurality of protruding connecting rods 155. The two curved parts 142 are driven thereby to stretch with respect to the fixed part 141. The two middle connecting rods 152 are adapted to move close to each other along the horizontal direction PD, thereby releasing the pushing against the protruding connecting rod 155. The curved parts 142 are thereby restored to the original position and move close to the fixed part 141.

Furthermore, referring to FIG. 2C and FIG. 3C, each of the middle connecting rods 152 has two pushing surfaces PS. Each of the protruding connecting rods 155 has a tilted surface TS. When the two middle connecting rods 152 move away from each other along the horizontal direction PD, each of the pushing surfaces PS partially contacts each of the tilted surfaces TS. When the two middle connecting rods 152 move close to each other along the horizontal direction PD, each of the pushing surfaces PS closely fits each of the tilted surfaces TS.

Referring to FIG. 1A, and FIG. 2A to FIG. 2C, when the flexible electronic device 100 is switched to the curve mode, the two linking pins 136 respectively move close to the center line CL of the bearing frame 140. The two linking rods 151 are driven thereby to generate pivotal rotations towards each other, with respect to the fixed part 141, and the two middle connecting rods 152 are further driven thereby to move away from each other along the horizontal direction PD. Thus the two pushing surfaces PS of each of the middle connecting rods 152 pushes each of the tilted surfaces TS of each of the protruding connecting rods 155, and both ends of each of the protruding connecting rods 155 pivotally rotate with respect to the inner support bracket 153 and the plurality of outer support brackets 154, so that the plurality of curved parts 142 is driven to stretch with respect to the fixed part 141. Meanwhile, the buffer part 143 and the flexible panel 160 are also pushed by the protruding connecting rod 155 to be curved (see FIG. 2B). Referring to FIG. 2B and FIG. 2C, the flexible panel 160 in this state is curved and suspended over the base 110, and is suitable for playing multimedia images or videos for the user to watch.

Referring to FIG. 1C and FIG. 3A to FIG. 3C, when the flexible electronic device 100 is switched to the flat mode, the two linking pins 136 respectively move away from the center line CL of the bearing frame 140. The two linking rods 151 are driven thereby to generate pivotal rotations towards each other with respect to the fixed part 141, and the two middle connecting rods 152 are further driven thereby to move close to each other along the horizontal direction PD. Thus the two pushing surfaces PS of each of the middle connecting rods 152 completely contact each of the tilted surfaces TS of each of the protruding connecting rods 155, and both ends of each of the protruding connecting rods 155 return to the original positions with respect to the inner support bracket 153 and the plurality of outer support brackets 154, so that the plurality of the curved parts 142 move close to the fixed frame 141. Further, the buffer part 143 and the flexible panel 160 are flattened thereby. Referring to FIG. 3B and FIG. 3C, the flexible panel 160 in this state is flat and is supported by the base 110 and the desktop, and is suitable for touch, drawing, writing functions and so on.

Furthermore, referring to FIG. 2A and FIG. 3A, a plurality of gaps G are formed in a staggered manner between the fixed part 141 and each of the curved parts 142. In the flat mode, the fixed part 141 and each of the curved parts 142 have not been curved, and therefore the plurality of gaps G are in the shape of a long strip (see FIG. 3A). In the curve mode, each of the curved parts 142 is stretched with respect to the fixed part 141, and therefore each of the gaps G is in the oval shape (see FIG. 2A). Herein, the size of each of the gaps G in the curve mode is larger than the size of each of the gaps G in the flat mode. The plurality of gaps G of the bearing frame 140 is beneficial for improving bending and stretching, and may be elastically deformed as the two curved parts 142 are stretched. In addition, each of the gaps G after stretching also has a heat dissipation effect.

In summary of the foregoing, the flexible electronic device of the disclosure is adapted to be switched between the curve mode and the flat mode. In the curve mode, the bending mechanism bends the bearing frame to increase the bending curvature of the flexible panel. In the flat mode, the bending mechanism restores the bearing frame to flatten the flexible panel. In addition, in the flat mode, the bearing frame and flexible panel can rotate with respect to the supporting plate to change the angle therebetween, thereby preventing the flexible panel from being suspended, and therefore the flexible panel is suitable for long-time touch operation.

Furthermore, the flexible electronic device of the disclosure may be quickly switched between the curve mode and the flat mode through rotation by an external force, which can overcome the disadvantage that the existing electronic device cannot have both a curved screen and a flat touchscreen at the same time, and provide a good user experience.

What is claimed is:

1. A flexible electronic device, comprising:
   a base;
   a supporting plate having a first end and a second end, the first end pivotally connected to the base;
   two pivot modules disposed at the second end of the supporting plate;
   a bearing frame having a fixed part and two curved parts, the fixed part connected to the pivot modules, and the curved parts respectively connected to two opposite sides of the fixed part;
   a bending mechanism disposed on the fixed part and the two curved parts, and connecting the pivot modules; and
   a flexible panel, disposed on the bearing frame and covering the bending mechanism and the pivot modules,
   wherein, when switching to a curve mode, the bending mechanism drives the curved parts to stretch with respect to the fixed part to bend the flexible panel, and when switching to a flat mode, the bending mechanism drives the curved parts to move close to the fixed part to flatten the flexible panel,
   wherein each of the pivot modules comprises:
     a pivot shaft;
     a first support bracket rotatably sleeved on the pivot shaft and connected to the bearing frame, the first support bracket having a sliding groove;
     a second support bracket sleeved on and fixed to the pivot shaft and connected to the second end of the supporting plate;
     a first cam member rotatably and moveably sleeved on the pivot shaft, a retaining part of the first cam member aligned with the sliding groove;
     a second cam member, sleeved on and fixed to the pivot shaft and adjacent to the second support bracket; and
     a linking pin disposed through the retaining part of the first cam member and the sliding groove, and connected to the bending mechanism.

2. The flexible electronic device according to claim 1, wherein in the curve mode, the supporting plate rotates in a first rotation direction with respect to the base, a first angle is formed between the supporting plate and the base, the bearing frame rotates through the pivot modules in a second rotation direction opposite to the first rotation direction with respect to the supporting plate, a second angle is formed between the bearing frame and the supporting plate, and the first angle and the second angle are acute angles.

3. The flexible electronic device according to claim 2, wherein in the flat mode, the supporting plate rotates in the second rotation direction with respect to the base, the supporting plate is stacked on the base, the bearing frame rotates in the first rotation direction with respect to the supporting plate through the pivot module, and the second angle is an obtuse angle.

4. The flexible electronic device according to claim 2, wherein each of the pivot modules further comprises an auxiliary elastic member and a torque member, the auxiliary elastic member sleeved on the pivot shaft and abutting against the first cam member to provide an elastic force, and the torque member sleeved on an end of the pivot shaft opposite to the second cam member and adjacent to the first support bracket to provide a torque.

5. The flexible electronic device according to claim 1, wherein when the second support bracket and the pivot shaft pivotally rotate in a first axial direction with respect to the first support bracket, the first cam member is driven to slide along the pivot shaft to move close to the second cam member, and the retaining part drives the linking pin to move in the sliding groove and relatively move close to a center line of the bearing frame.

6. The flexible electronic device according to claim 5, wherein when the second support bracket and the pivot shaft pivotally rotate in a second axial direction opposite to the first axial direction with respect to the first support bracket, the first cam member is driven to slide along the pivot shaft to partially abut against the second cam member and form a distance, and the retaining part drives the linking pin to move in the sliding groove and relatively move away from the center line of the bearing frame.

7. The flexible electronic device according to claim 6, wherein the bending mechanism comprises:
   two linking rods pivotally connected to the fixed part and having a first end part and a second end part, each of the first end parts pivotally connected to each of the linking pins;
   two middle connecting rods pivotally connected to the second end part, respectively;
   a plurality of inner support brackets respectively disposed on both sides of the fixed part and facing the flexible panel;
   a plurality of outer support brackets respectively disposed on the curved parts and facing the flexible panel; and
   a plurality of protruding connecting rods rotatably connected to the corresponding inner support brackets and the corresponding outer support brackets, respectively, the middle connecting rods abutting against the protruding connecting rods,
   wherein the middle connecting rods are adapted to move away from each other along a horizontal direction, and push against the protruding connecting rods to pivotally rotate with respect to the inner support brackets and the outer support brackets, to drive the curved parts to stretch with respect to the fixed part, and the middle connecting rods are adapted to move close to each other along the horizontal direction to release the pushing against the protruding connecting rods, so that the curved parts move close to the fixed part.

8. The flexible electronic device according to claim 7, wherein each of the middle connecting rods has two pushing surfaces, each of the protruding connecting rods has a tilted surface, when the middle connecting rods move away from each other along the horizontal direction, each of the pushing surfaces partially contacts each of the tilted surfaces, and when the middle connecting rods move close to each other along the horizontal direction, each of the pushing surfaces closely fits to each of the tilted surfaces.

9. The flexible electronic device according to claim 1, wherein the bearing frame has two buffer members, the two buffer members are disposed on the fixed part and the two curved parts and are parallel to each other, and the flexible panel is disposed on the two buffer members.

10. The flexible electronic device according to claim 1, where a plurality of gaps are formed in a staggered manner between the fixed part and each of the curved parts, and in the curve mode, each of the curved parts stretches with respect to the fixed part, so that a size of each of the gaps is larger than a size of each of the gaps in the flat mode.

11. The flexible electronic device according to claim 1, further comprising a plurality of inner rotating support brackets and a plurality of outer rotating support brackets, the inner rotating support brackets respectively disposed on both sides of the fixed part and facing the flexible panel, the outer rotating support brackets respectively disposed on the curved parts and facing the flexible panel, and each of the outer rotating support brackets pivotally connected to each of the corresponding inner rotating support brackets so that each of the curved parts is bendable with respect to the fixed part.

* * * * *